United States Patent
Aderhold et al.

(10) Patent No.: US 12,176,242 B2
(45) Date of Patent: Dec. 24, 2024

(54) ROTATABLE THERMAL PROCESSING CHAMBER

(71) Applicant: Applied Materials, Inc., Santa Clara, CA (US)

(72) Inventors: Wolfgang R. Aderhold, Cupertino, CA (US); Dongming Iu, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 352 days.

(21) Appl. No.: 17/581,678

(22) Filed: Jan. 21, 2022

(65) Prior Publication Data
US 2023/0238269 A1     Jul. 27, 2023

(51) Int. Cl.
*H01L 21/687*     (2006.01)
*H01L 21/67*     (2006.01)

(52) U.S. Cl.
CPC .. *H01L 21/68785* (2013.01); *H01L 21/67109* (2013.01); *H01L 21/68721* (2013.01); *H01L 21/68742* (2013.01)

(58) Field of Classification Search
CPC ........ H01L 21/67098–67115; H01L 21/68785; H01L 21/68742; H01L 21/68735; H01L 21/68714; H01L 21/68792; H01L 21/6838; H01L 21/683
See application file for complete search history.

(56) References Cited

U.S. PATENT DOCUMENTS

| | | | |
|---|---|---|---|
| 6,159,055 A | 12/2000 | Satitpunwaycha et al. | |
| 6,676,759 B1* | 1/2004 | Takagi | H01L 21/68735 156/345.52 |
| 10,571,337 B2 | 2/2020 | Hawrylchak et al. | |
| 2009/0010626 A1 | 1/2009 | Ramamurthy et al. | |
| 2011/0042906 A1* | 2/2011 | Aichholzer | H01L 21/68742 279/155 |
| 2013/0183834 A1* | 7/2013 | Rogers | H01L 21/02301 118/712 |
| 2017/0198395 A1* | 7/2017 | Nozawa | H01L 21/3065 |
| 2018/0130696 A1 | 5/2018 | Konkola et al. | |

FOREIGN PATENT DOCUMENTS

CN     202884037 U     4/2013

OTHER PUBLICATIONS

International Search Report/Written Opinion issued to PCT/US2022/052330 on May 4, 2023.
Magnatic Fluid Seal, Eagle Burgmann. CAT No. N004E-11122. www.eagleburgmann.jp. Jan. 6, 2022.

* cited by examiner

*Primary Examiner* — Tyrone V Hall, Jr.
(74) *Attorney, Agent, or Firm* — Patterson + Sheridan, LLP

(57) ABSTRACT

The present disclosure relates to heating a substrate in a rapid thermal processing (RTP) chamber. The chamber may contain a rotatable assembly configured to accommodate and rotate the substrate while a heat source inside the RTP chamber applies heat to the substrate. The rotatable assembly is partially disposed outside the RTP chamber. A seal may formed around the rotatable assembly and maintain a vacuum inside the RTP chamber while the rotatable assembly rotates. The rotatable assembly may configured to accommodate various-sized substrates.

20 Claims, 10 Drawing Sheets

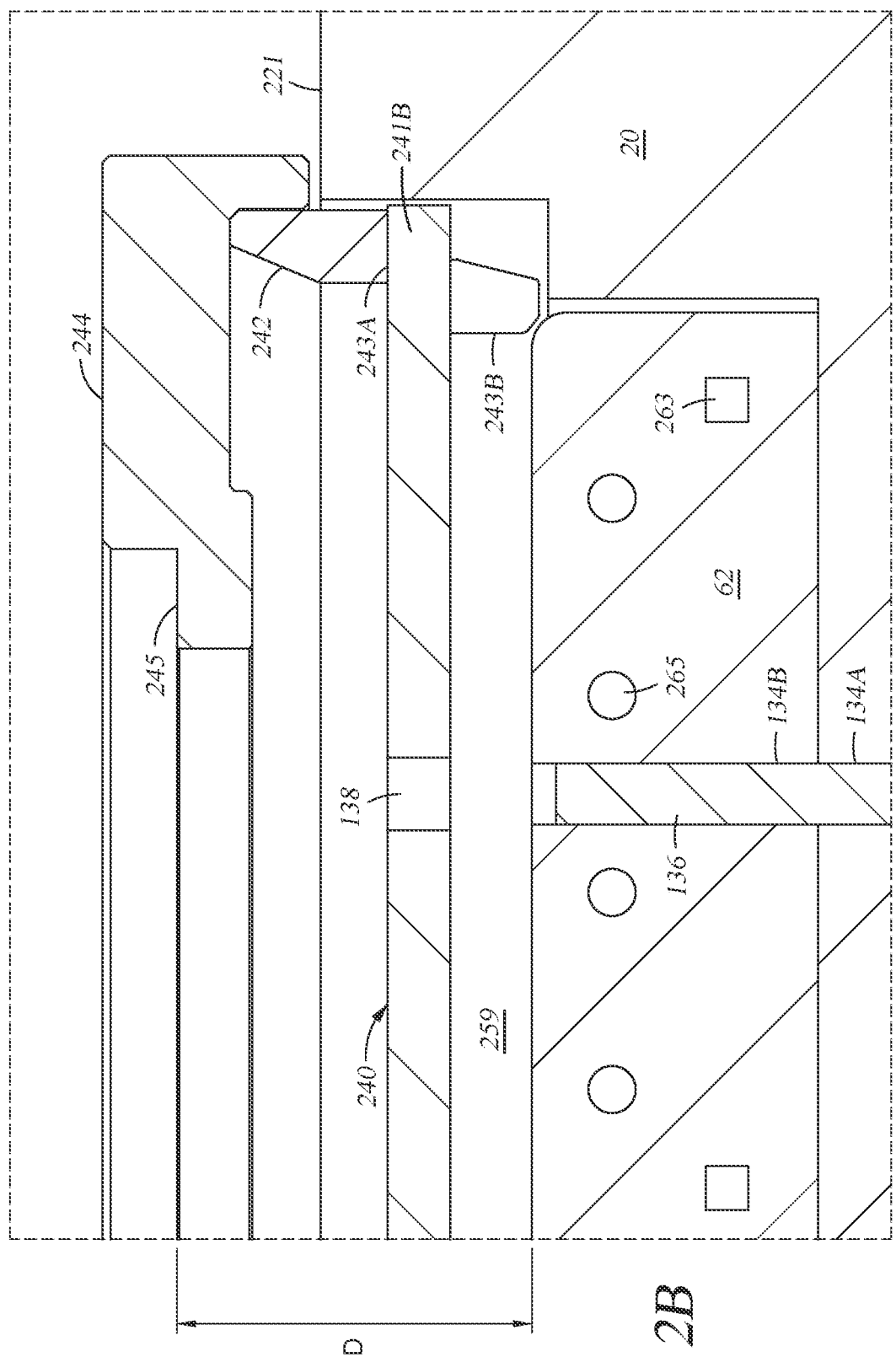

ROTATABLE THERMAL PROCESSING CHAMBER

BACKGROUND

Field

Embodiments of the present disclosure generally relate to apparatuses and methods of annealing substrates suitable for semiconductor processing. More particularly, embodiments of the disclosure relate to rotating a substrate during annealing.

Description of the Related Art

Thermal processing chambers commonly expose a substrate to radiation from thermal sources to raise the temperature of the substrate, either of the whole substrate or a part or surface area of the substrate. The radiation used to heat the substrate can create a strong background radiation environment in the chamber. Thus, thermal processing chambers may beat the substrate unevenly during annealing processes.

Accordingly, what is needed in the art are apparatus and methods for solving the problems described above.

SUMMARY

Embodiments of the present disclosure generally relate to apparatuses and methods of annealing substrates suitable for semiconductor processing. More particularly, embodiments of the disclosure relate to rotating a substrate during annealing.

Certain embodiments provide a thermal processing chamber. The chamber includes a rotatable assembly configured to rotate about an axis of the thermal processing chamber. The rotatable assembly includes a rotatable pedestal having a pedestal shaft and a pedestal plate. The pedestal plate is coupled to an end of the pedestal shaft and the pedestal shaft extends outside the thermal processing chamber. The pedestal shaft is disposed in a pedestal housing coupled to the thermal processing chamber. The rotatable pedestal further includes a substrate support plate removably coupled to the pedestal plate. The chamber further includes a magnetic fluid seal disposed between the pedestal shaft and the pedestal housing. The magnetic fluid seal is configured to maintain a vacuum inside the thermal processing chamber.

Other embodiments provide a rotatable assembly configured to rotate about an axis of a thermal processing chamber. The rotatable assembly includes a pedestal having a pedestal shaft and a pedestal plate. The pedestal shaft is disposed within a pedestal housing. The rotatable assembly further includes a reflector plate coupled to the pedestal plate. The reflector plate has a first plurality of features formed therein. The rotatable assembly further includes a substrate support plate removably coupled to the reflector plate. The substrate support plate includes a second plurality of features formed therein. The substrate support plate further includes a third plurality of features formed therein. The third plurality of features are configured to couple to at least a portion of the first plurality of features. The rotatable assembly further includes a magnetic fluid seal disposed between the pedestal shaft and the pedestal housing.

Other embodiments provide a thermal processing chamber. The chamber includes a rotatable assembly configured to rotate about a central axis of the thermal processing chamber. The rotatable assembly includes a pedestal having a pedestal shaft and a pedestal plate. The pedestal shaft is disposed within a pedestal housing. The rotatable assembly further includes a reflector plate coupled to the pedestal plate, wherein the reflector plate has a first plurality of features formed therein. The rotatable assembly further includes a substrate support plate removably coupled to the reflector plate. The substrate support plate includes a second plurality of features formed therein. The substrate support plate further includes a third plurality of features formed therein. The third plurality of features are configured to couple to at least a portion of the first plurality of features. The substrate support plate further an edge ring removably coupled to the substrate support plate. The edge ring includes at least one tab configured to couple to at least a portion of the second plurality of grooves. The edge ring further includes a lip configured to support a substrate. The chamber further includes a magnetic seal configured disposed between the pedestal shaft and the pedestal housing. The chamber further includes a plurality of lift pins disposed in a first plurality of openings formed by the thermal processing chamber. The lift pins are configured to be disposed in a second plurality of openings formed by the reflector plate and a third plurality of openings formed by the substrate support plate when the rotatable assembly is in a first position about the central axis. The lift pins are configured to lift the reflector plate when the rotatable assembly is in a second position about the central axis.

Other embodiments include a method for rotating a rotatable assembly in a thermal processing chamber. The method includes placing a substrate on an edge ring of the rotatable assembly. The method further includes rotating the rotatable assembly about an axis of the thermal processing chamber from a first position about the axis to a second position about the axis. The rotatable assembly includes a pedestal having a pedestal shaft and a pedestal plate. The pedestal plate is coupled to an end of the pedestal shaft and the pedestal shaft extends outside the thermal processing chamber. The rotatable assembly includes a substrate support plate removably coupled to the pedestal plate. The substrate support plate rotates with the pedestal as part of the rotatable assembly. A magnetic fluid seal is formed to maintain a vacuum inside the thermal processing chamber. The method further includes heating the substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIGS. 2B-2D depict enlarged views of different cross-sections of the rotatable assembly in FIG. 2A, according to some embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the present disclosure. However, it will be apparent to one of skill in the art that some embodiments of the present disclosure may be practiced without one or more of these specific details. In other instances, well-known features have not been described in order to avoid obscuring one or more embodiments of the present disclosure.

The present disclosure relates to heating a substrate in a rapid thermal processing (RTP) chamber. The chamber may contain a rotatable assembly configured to accommodate and rotate the substrate while a heat source inside the RTP chamber applies heat to the substrate. The rotatable assembly is partially disposed outside the RTP chamber. A seal may be formed around the rotatable assembly and maintain a vacuum inside the RTP chamber while the rotatable assembly rotates. The rotatable assembly may be configured to accommodate various-sized substrates.

The methods and systems disclosed herein include novel features for heating the substrate, for example, during annealing. The embodiments of the rotatable assembly may result in even heating of the substrate with minimal or no increase in size of the RTP processing chamber. Moving parts may be minimized, which beneficially may decrease maintenance and wear on the system and result in higher reliability. The seal around the rotatable assembly may reduce or eliminate rubbing surfaces, beneficially reducing particles and debris generated during operation.

The methods and systems disclosed herein may provide features that overcome many of the disadvantages associated with conventional RTP processing chambers described above.

Examples of a Thermal Processing Chamber

Figure 1:
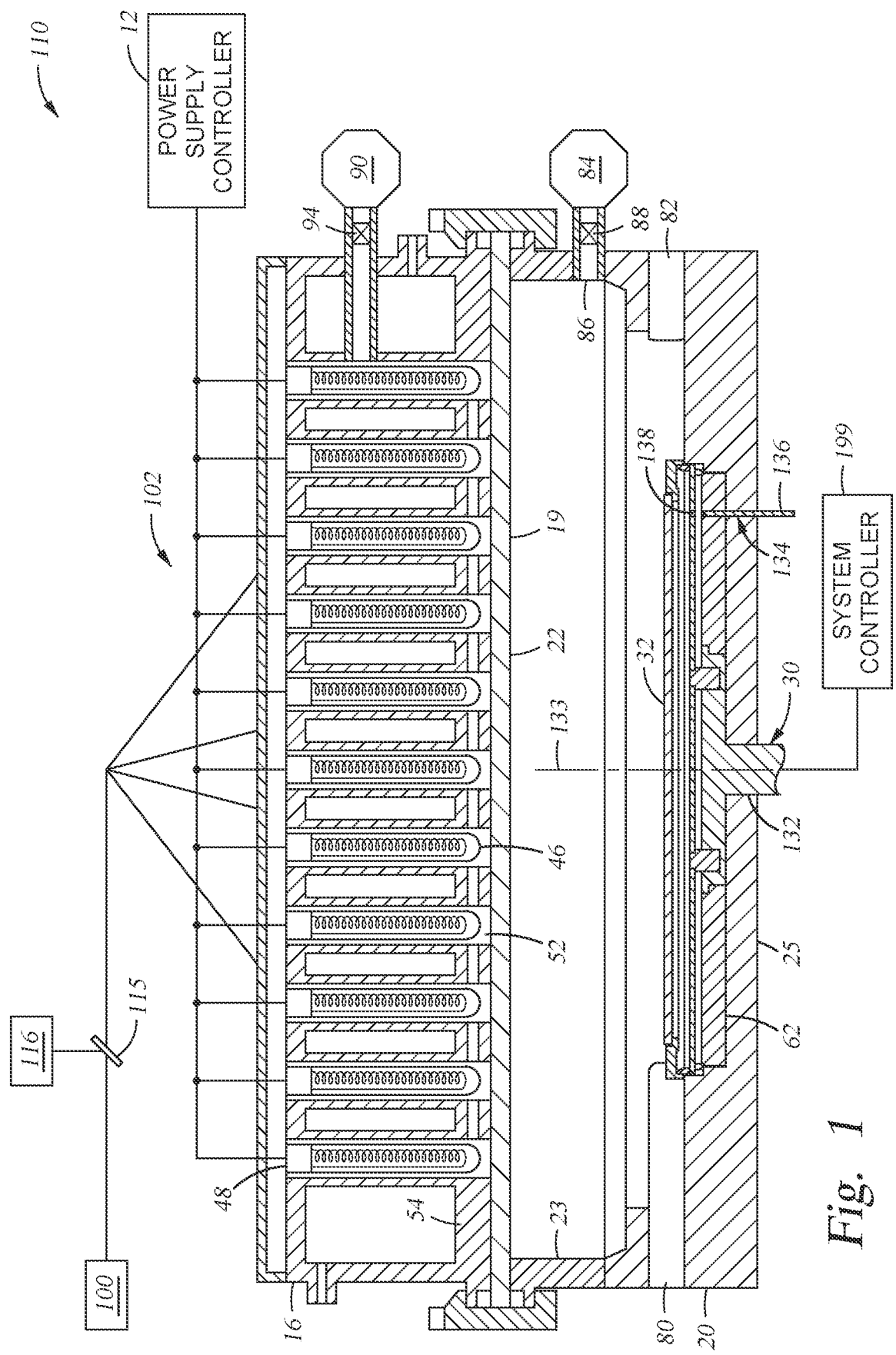
FIG. 1 depicts a cross sectional view of a rapid thermal processing (RTP) chamber, according to some embodiments.

FIG. 1 depicts a cross-sectional view of an RTP chamber 110 (referred to as the chamber 110) according to examples of the present disclosure. The chamber 110 includes a chamber body 20, an upper portion 23, and a window 22 disposed on the upper portion 23. A lamp assembly 16 is disposed on the window 22. The lamp assembly 16 includes a housing 54 and a first plurality of openings 52 formed in the housing 54. In some embodiments, a second plurality of openings (not shown) may be formed in the housing 54. A plurality of lamps 46 is disposed in the housing 54, and each lamp 46 is disposed within a corresponding opening 52. The lamps 46 are connected to a power supply controller 12 via a plurality of electrical sockets 48. During operation, the lamps 46 emit radiation through the window 22 toward a substrate 32 disposed in the chamber 110 to heat the substrate 32 to a predetermined temperature. The predetermined temperature may range from about 20 degrees Celsius to about 1500 degrees Celsius. In some embodiments, the substrate is heated to a relatively low temperature, such as from about 20 degrees Celsius to about 350 degrees Celsius. In some embodiments, the substrate is heated to a relatively high temperature, such as from about 350 degrees Celsius to about 1500 degrees Celsius. The window 22 is generally made of any material resistant to the processing environment and transmissive to the desired radiation. For example, quartz is typically used for the window 22 since quartz is transparent to infrared light. Other suitable materials include, but are not limited to, sapphire. In further examples, the window 22 is optionally coated with an anti-reflective coating or any other suitable filters, on one or both sides of the window 22. For example, optional ultra-violet (UV) filters are used to avoid generation of ions and radicals in the chamber or damage to UV-sensitive structures on the substrate 32, if the lamps 46 have significant UV output. As another example, optional notch filters are used to admit narrow band radiation. In some embodiments, a filter 19 is coated on an inside surface of the window 22, as shown in FIG. 1. The filter 19 blocks radiation having wavelengths within a specific range, such as between about 780 nm and about 880 nm, while transmitting radiation having wavelengths outside of the specific range. The filter 19 may be a plurality of alternating layers, such as oxide layers. In one embodiment, the filter 19 includes alternating silicon dioxide layers and titanium dioxide layers, and silicon dioxide layers are located at opposite ends of the filter. In one embodiment, the filter 19 includes a total of 30 to 50 alternating layers. The filter 19 may be coated on an outside surface (facing the lamp assembly 16) of the window 22, an inside surface (facing the substrate support) of the window 22, or may be embedded in the window 22.

A radiation source 100 is connected to the lamp assembly 16 via a source manifold 102. For clarity, the radiation source 100 is shown as being located outside of the chamber 110; however, it is also contemplated that the radiation source 100 may be located inside the chamber 110. The radiation source 100 generally includes one or more radiation emitting devices that are distinct from the lamps 46.

The chamber 110 optionally includes a beam splitter 115 in optical communication with the radiation emitted by the radiation source 100. In operation, the beam splitter 115 directs radiation from the radiation source 100 to a sampling detector 116, which is used to detect source modulation directly from the radiation source 100. The sampling detector 116 helps to compensate for any pulse-to-pulse modulation or other amplitude modulation. The beam splitter 115 typically has a low reflectance ratio, for example less than or equal to about 30 percent, such as about 20 percent, to avoid over-attenuating the radiation from the radiation source 100. In one example, the beam splitter 115 is a fiber coupled splitter, which is connected to the sampling detector 116 through a fiber. In FIG. 1, the beam splitter 115 is shown outside of the chamber body 20; however, the beam splitter 115 may also be positioned inside of the chamber 110, and not fiber coupled to the radiation source 100, for example, in the processing region, to detect the radiation emitted from the radiation source 100.

An inlet port 80 and an outlet port 82 are formed in the chamber body 20 of the chamber body 20. During operation, the pressure within the chamber 110 can be reduced to a sub-atmospheric pressure prior to introducing a process gas through the inlet port 80. A vacuum pump 84 evacuates the chamber 110 by pumping through an exhaust port 86 formed in the chamber body 20. A valve 88 disposed between the exhaust port 86 and the vacuum pump 84 is utilized to control the pressure within the chamber 110. A second vacuum pump 90 is connected to the lamp assembly 16 to reduce the pressure within the lamp assembly 16, particularly when the pressure within the chamber 110 is pumped to a reduced pressure to reduce the pressure differential across the window 22. The pressure within the lamp assembly 16 is controlled by a valve 94.

A rotatable assembly 30 is disposed within the chamber 110 and rotates about a central axis 133 of the chamber 110. As shown, the rotatable assembly 30 is at least partially disposed through a reflector plate 62 and a central opening 132 of a bottom 25 of the chamber body 20. As shown, the central axis 133 is aligned with a center of the central opening 132. The substrate 32 may be disposed on the rotatable assembly 30 such that the substrate 32 rotates with the rotatable assembly 30 while the rest of the chamber 110, including the reflector plate 62, does not rotate. The lamps 46 heat the substrate 32 as previously discussed. Rotating the substrate 32 during heating may beneficially result in even heating of the substrate 32. In some embodiments, the reflector plate 62 and/or the pedestal plate 260A absorbs heat transmitted from the substrate 32 and radiates the heat back towards the substrate 32. In some embodiments, the reflector plate 62 and/or the pedestal plate 260A reflects heat from the substrate 32 and directs the reflected heat towards the substrate 32. In some embodiments, such as discussed in relation to FIG. 2A, the reflector plate 62 contains at least one resistive heater 265 to radiate heat towards the substrate 32. In some embodiments, the pedestal plate 260A may contain at least one resistive heater.

Figure 2A:
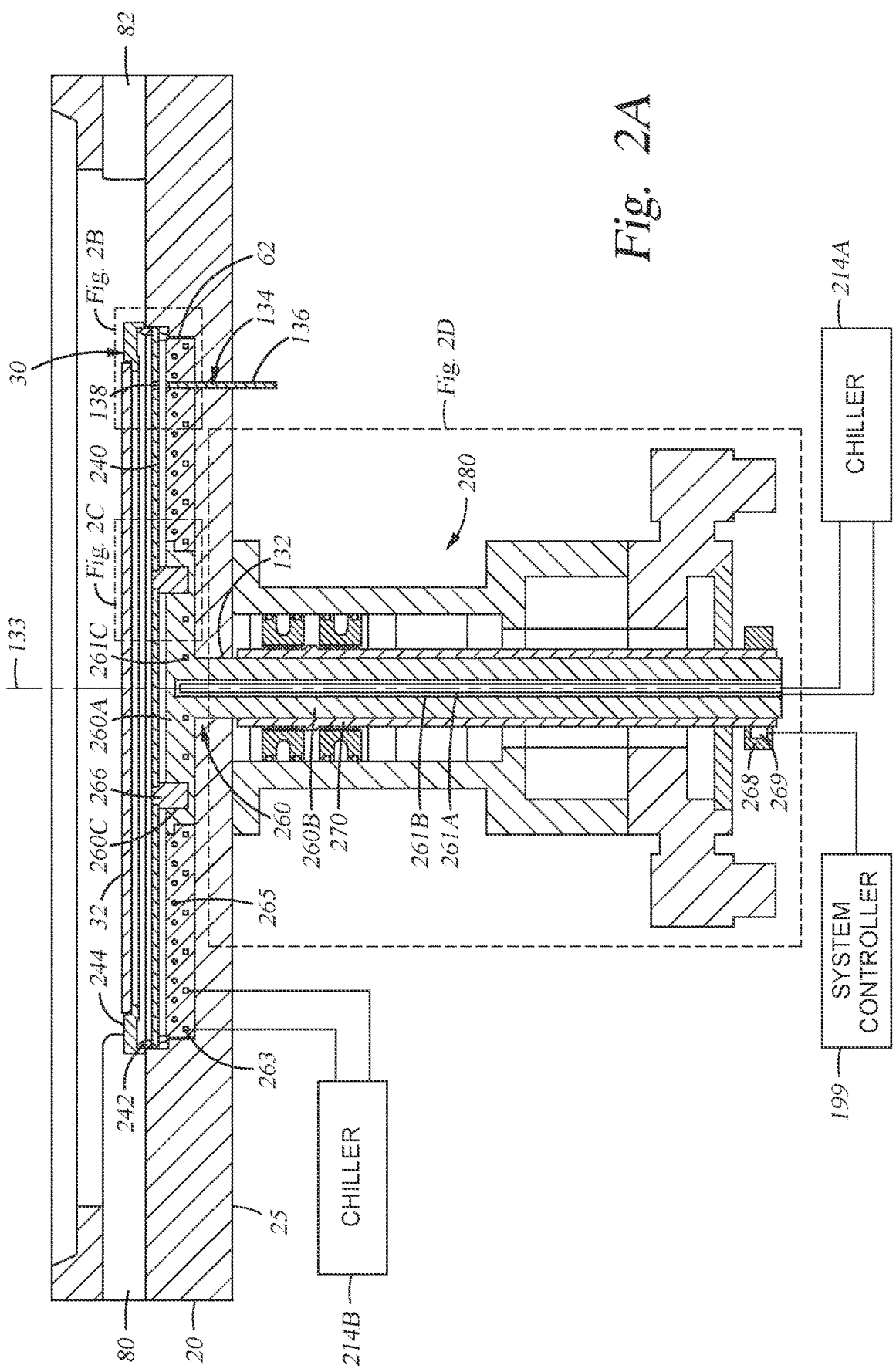
FIG. 2A depicts a cross sectional view of a rotatable assembly, according to some embodiments.

The chamber body 20 and the reflector plate 62 each incudes a first plurality of openings 134 (e.g., openings 134A and 134B in FIG. 2B). A plurality of lift pins 136 (e.g., three lift pins equally about a radius of the central axis 133) are positioned to be extended through the first plurality of openings 134. A seal (not shown), such as an O-ring, ceramic tight fit, or bellows, may form a seal between the lift pins 136 and the openings 134A to maintain the pressure within the chamber 110. In some embodiments, at least one actuator (not shown) may move the lift pins 136 in and out of the chamber 110 and a seal may be formed between the at least one actuator and the chamber 110. The rotatable assembly 30 includes a second plurality of openings 138. Each of the second plurality of openings 138 may be aligned with a corresponding opening 134 of the first plurality of openings 134 such that the lift pins 136 may extend through the second plurality of openings 138 and lift the substrate 32. A system controller 199 may control rotation of the rotatable assembly 30 as further described in relation to FIGS. 2A and 7. The system controller 199 may interface with a rotation sensor (e.g., an encoder 269 in FIG. 2A) to measure an angular position about the central axis 133 of the rotatable assembly 30 in relation to the chamber body 20. The system controller 199 may further align the openings 134 and 138 before the lift pins 136 are extended through the openings 138 to lift the substrate 32.

The lift pins may be positioned in relation to the substrate 32. In some embodiments, the lift pins 136 are a nominal radial distance of 6 inches from the central axis 133. In some embodiments, the lift pins 136 are a nominal radial distance of 4 inches from the central axis 133. In some embodiments, the lift pins are nominal radial distance of 3 inches from the central axis 133. The lift pins 136 may be positioned based on the diameter of the substrate 32 to be lifted.

In some embodiments, at least one thermal detector (not shown), such as a pyrometer, such as a transmission pyrometry detector, or temperature sensor may be used to assess the thermal state of the substrate 32. For example, the at least one pyrometer may measure a radiation spectra of the substrate 32 at a range of wavelengths (more than just one or two primary wavelengths) to infer the temperature of the substrate 32.

Examples of a Rotatable Assembly

FIG. 2A depicts a cross sectional view of the rotatable assembly 30, according to some embodiments. In particular, FIG. 2A shows the rotatable assembly 30 disposed in the chamber body 20 and a pedestal housing 280 coupled to the bottom 25 of the chamber body 20.

In the embodiment depicted in FIG. 2A, the rotatable assembly 30 comprises a pedestal 260 having a pedestal plate 260A and a pedestal shaft 260B. The pedestal shaft 260B is disposed in the central opening 132 of the chamber body 20, and a motor 268 rotates the pedestal 260 about the central axis 133. In the depicted embodiment, the pedestal shaft 260B is disposed in a pedestal sleeve 270 and the motor 268 rotates the pedestal sleeve 270, which in turn rotates the pedestal shaft 260B and pedestal 260. The system controller 199 controls a position of the pedestal plate 260A using the motor 268 and the encoder 269. The encoder 269 and the motor 268 may be integrated into the system controller 199 as an input and an output, respectively, as further discussed in relation to FIG. 5. In further embodiments, the system controller 199 may calculate a rotation rate of the pedestal 260 using the encoder 269. The pedestal shaft 260B and the pedestal sleeve 270 are disposed in the pedestal housing 280 as further discussed in relation to FIG. 2D. The pedestal 260 may be removed from the pedestal sleeve 270, which beneficially allows the chamber 110 (FIG. 1) to use different pedestals 260. For example, a pedestal 260 with a different pedestal plate 260A, such as a pedestal plate 260A comprising a reflector plate 62, may be used.

The pedestal plate 260A transfers the rotation of the pedestal 260 to a substrate support plate 240 (referred to as the support plate 240). The support plate 240 may shield the reflector plate 62 and the pedestal plate 260A from being coated by outgassing substrate 32 material. In the depicted embodiment, a plurality of transfer pins 266 are disposed in a third plurality of openings 260C in the pedestal plate 260A. A fourth plurality of openings 241A are in the support plate 240. Each of the fourth plurality of openings 241A is aligned to a corresponding opening of the third plurality of openings 260C such that the transfer pins 266 are further disposed in the fourth plurality of openings 241A when the support plate 240 is placed on the pedestal 260.

An adapter ring 242 removably attaches an edge ring 244 to the support plate 240, which beneficially allows the edge ring 244 to be easily adjusted or replaced. The edge ring 244 may be sized to accept the substrate 32 such that the substrate 32 is disposed on the edge ring 244 during operation. The adapter ring 242 may also be sized to adjust a distance between the substrate 32 and the reflector plate 62, such as discussed in relation to FIG. 2B. The substrate 32 may be a high resistivity silicon substrate. In some embodiments, the edge ring 244 is sized to accept substrates 32 varying in size. In some embodiments, different edge rings 244 are used, where each edge ring 244 corresponds to a substrate 32 of a different size and the adapter ring 242 adapts each edge ring 244 to fit the support plate 240. For example, the edge ring 244 may be sized to accept a 675 mm substrate, or a 450 mm substrate, or a 300 mm substrate, or a 200 mm substrate, or a 150 mm substrate. In some embodiments, such as where the pedestal housing 280 may be smaller, the edge ring 244 may be sized to accept a 125 mm substrate, or a 100 mm substrate, or a 76 mm substrate, or a 51 mm substrate or smaller. In some embodiments, the adapter ring 242 may be referred to as an interface ring. The edge ring 244, the adapter ring 242, and the support plate 240 are further discussed in relation to FIG. 2B.

The reflector plate 62 surrounds the pedestal plate 260A and may radiate or reflect heat towards the substrate 32 as previously discussed in relation to FIG. 1. In such embodiments, the support plate 240 may be optically transparent to allow the heat to pass through to the substrate 32. In some embodiments, the support plate 240 is optically transparent to allow pyrometers to take measurements and assess a thermal state of the substrate 32. In some embodiments, the support plate 240 is made of a similar material as the window 22 (FIG. 1). For example, the support plate 240 may comprise quartz and in such embodiments may be referred to as a quartz plate. In some embodiments, the support plate 240 comprises a heat conductive material, such as a metal, for example aluminum, to absorb heat and radiate the absorbed heat towards the substrate 32.

The pedestal shaft 260B includes a coolant inlet 261A and a coolant outlet 261B to flow a first coolant from a first chiller 214A. The pedestal plate 260A includes a channel 261C formed therein that is in fluid communication with the inlet 261A and outlet 261B for the first coolant to flow therethrough. In the depicted embodiment, the coolant inlet 261A is disposed within the coolant outlet 261B and the inlet 261A and the outlet 261B are disposed on the central axis 133, which beneficially allows the pedestal 260 to rotate while a first chiller 214A cools the pedestal 260. A rotating joint or seal (not shown), such as a mechanical seal, bearing, bushing, or packing, may be used to seal the rotating inlet 261A and outlet 261B from non-rotating lines connected to the first chiller 214A. The reflector plate 62 includes a channel 263 formed therein to allow a second coolant to flow therethrough. The second coolant flows from a second chiller 214B. The first coolant may be the same or different from the second coolant. In some embodiments, the first and/or second coolant is water such as tap water, deionized water, distilled water, or reverse osmosis water. In some embodiments, the first and/or second coolant comprises glycol.

In the depicted embodiment, the chamber 110 (FIG. 1) comprises a dual-sided heating configuration, where both sides of the substrate 32 are heated. The lamps 46 (FIG. 1) heat a first side of the substrate 32 and the reflector plate 62 heats a second side of the substrate 32. The reflector plate 62 optionally includes one or more resistive heaters 265 embedded therein. The resistive heaters 265 are utilized to elevate the temperature of the reflector plate 62 to radiate heat toward the substrate 32 disposed on the edge ring 244. The resistive heaters 265 are coupled to a heater power source (not shown). In some embodiments, the heater power source may be the power supply controller 12 (FIG. 1). In some embodiments, the system controller 199 controls the heater power source and/or the resistive heaters 265. In some embodiments, the resistive heaters 265 are not used because the reflector plate 62 and the pedestal plate 260A radiate or reflect heat from the substrate 32.

In some embodiments, the cooling channels 263 are only be at the outermost area of the reflector plate 62 (e.g., an area furthest from the central axis 133), which beneficially cools the adapter ring 242 and the edge ring 244. For example, during some operations, the edge ring 244 may retain heat that can cause a temperature at a corresponding edge of the substrate 32 (e.g., an edge furthest away from the central axis 133) to be higher than a temperature at a center of the substrate 32 (e.g., an area at or near the central axis 133).

In some embodiments, the pedestal 260 and/or the reflector plate 62 do not have a cooling system with cooling channels 261C or 263.

In some embodiments, the pedestal plate 260A and the reflector plate 62 are each be fabricated from a material having high heat conductivity, such as a metal, for example, aluminum.

In some embodiments, an interior of the pedestal sleeve 270 may be tapered towards the central axis 133 at an end near the motor 268. The pedestal shaft 260B may be similarly tapered such that a weight of the pedestal 260 couples the pedestal shaft 260B to the pedestal sleeve 270 during rotation. The tapered pedestal sleeve 270 beneficially allows the pedestal 260 to be easily installed and removed into the pedestal sleeve 270 without additional hardware.

Figure 2C:
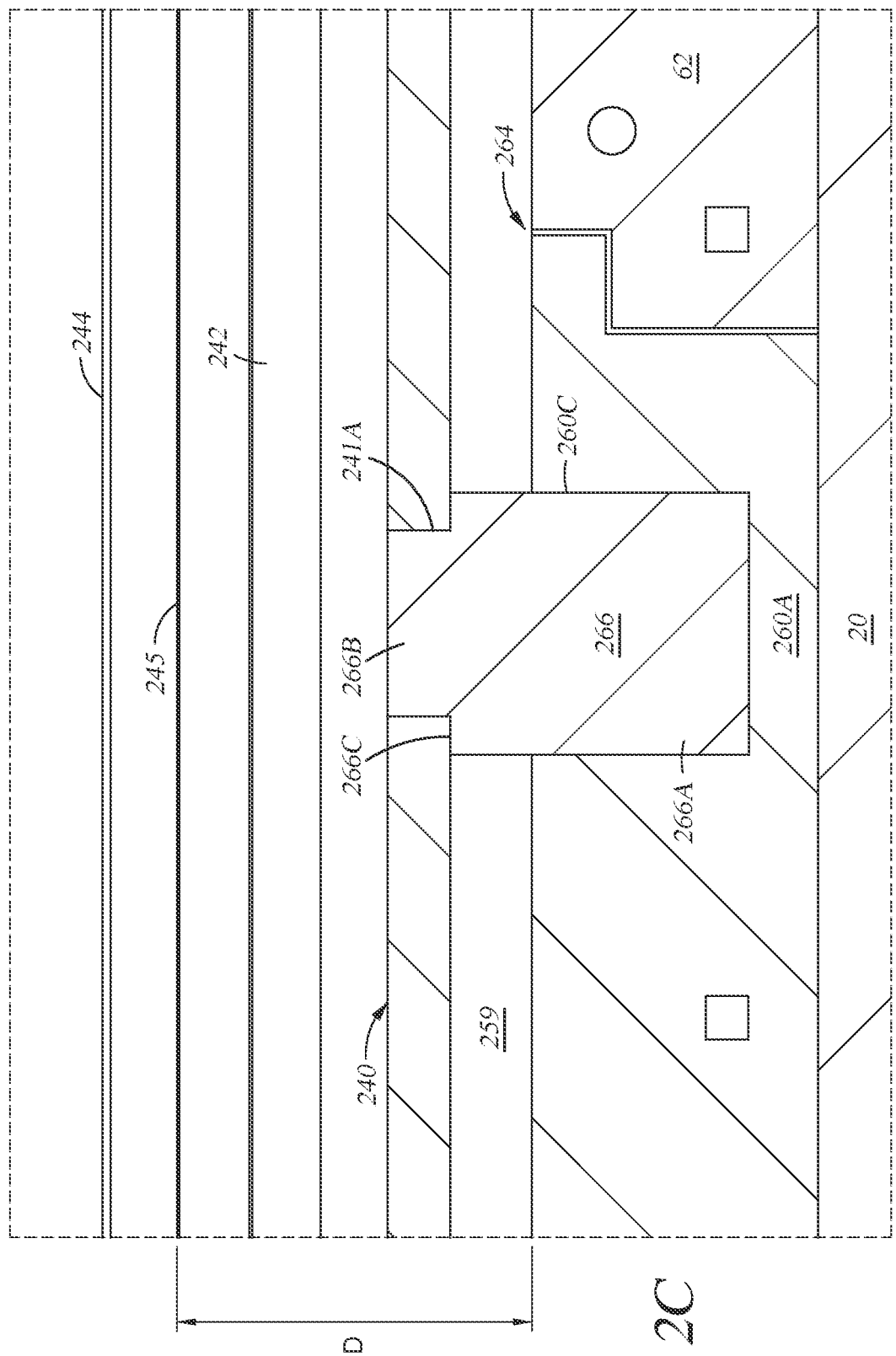
Figure 2D:
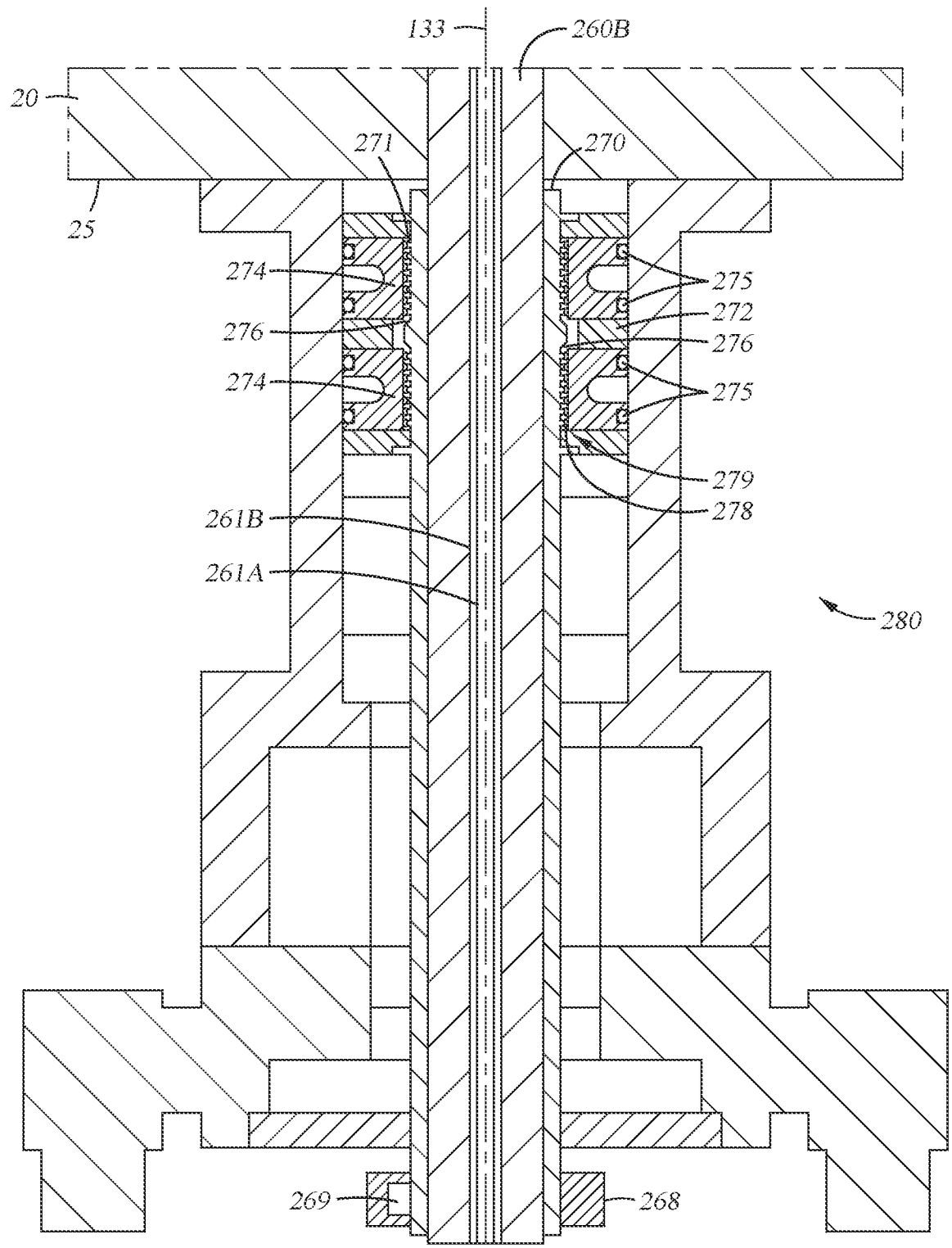

FIGS. 2B-2D depict enlarged views of different cross-sections of the rotatable assembly 30 in FIG. 2A, according to some embodiments. The substrate 32 is removed from FIGS. 2B-2D in order to more clearly show components of the rotatable assembly 30.

In particular, FIG. 2B shows a stackup of the rotatable assembly 30 including the lift pins 136. In the depicted embodiment, the support plate 240 comprises a plurality of tabs 241B at or near an edge or the support plate 240 (e.g., furthest from the central axis 133 in FIG. 2A). The adapter ring 242 forms a plurality of notches 243A that interlock with the tabs 241B of the support plate 240. As shown, one of the tabs 241B is disposed in one of the notches 243A formed by the adapter ring 242. The tabs 241B operationally engage the notches 243A when the support plate 240 rotates, causing the adapter ring 242 to rotate with the support plate 240. The tabs 241B and the notches 243A are discussed further in relation to FIG. 3. A gap 259 is formed in between the reflector plate 62 and the support plate 240. The edge ring 244 rests on the adapter ring 242 and the substrate 32 (FIG. 2A) rests on a lip 245 of the edge ring 244. The adapter ring 242 positions the substrate 32 (FIG. 2A) a distance (D) from the reflector plate 62. The adapter ring 242, the edge ring 244, and the substrate 32 move with the support plate 240 and the pedestal 260. In the depicted embodiment, the edge ring 244 overhangs an edge 221 of the chamber body 20. The overhang blocks light from the lamps 46 (FIG. 1), which beneficially improves an accuracy of the pyrometers. In some embodiments, the edge ring 244 does not overhang the edge 221 of the chamber body 20 and other means, such as filters, may be used to compensate for the light from the lamps 46.

In the depicted embodiment, the adapter ring 242 comprises a feature 243B formed at or near an edge or the adapter ring 242 (e.g., furthest from the central axis 133 in FIG. 2A). The feature 243B may be a fin. In some embodiments, the feature 243B provides extra thermal mass. The feature 243B may be continuous or discontinuous. In some embodiments, the feature 243B is cylindrical. In some embodiments, the feature 243B is a plurality of discrete fins. As shown, the feature 243B is formed on a surface of the adapter ring 242 that is facing the reflector plate 62. In some embodiments, the feature 243B directs heat emitted or reflected by the reflector plate 62 towards the substrate 32 (FIG. 2A), and thus prevents the heat from being lost to the surrounding chamber body 20. In some embodiments, the feature 243B shields the reflector plate 62 from heat generated by the lamps 46 (FIG. 1).

The chamber body 20 forms the openings 134A, which extend from the bottom 25 (FIG. 2A) of the chamber body 20 to the reflector plate 62. The reflector plate 62 forms the openings 134B, which are aligned with the openings 134A. Lift pins 136 extend through the openings 134, as previously discussed in relation to FIG. 1. In some embodiments, the lift pins 136 may reside inside the chamber 110 such that there are no openings 134A in the chamber body 20. In some embodiments, the lift pins may be disposed in between the reflector plate 62 and the rotatable assembly 30 such that there are no openings 134A or 134B. The lift pins 136 may be moved by an actuator (not shown) or by vertical movement (as shown on the page) of the rotatable assembly 30.

In some embodiments, the system controller 199 (FIG. 2A) may rotate the pedestal 260 to align the openings 138 of the support plate 240 with the openings 134. The lift pins 136 may then be raised to accept the substrate 32 and lowered to place the substrate 32 on the edge ring 244. The lift pins 136 may also be raised to lift the substrate 32 for inspection or subsequent processing. The system controller 199 may position the pedestal 260 such that the openings 134 and 138 are not aligned. The lift pins 136 may then be used to lift the support plate 240, which beneficially helps removal of the support plate 240 for cleaning or replacing with a different support plate 240.

FIG. 2C shows how the transfer pins 266 removably couple the support plate 240 to the pedestal plate 260A. A single transfer pin 266 is shown. A main body 266A of the transfer pin 266 is disposed in the opening 260C of the pedestal plate 260A. A peg 266B of the transfer pin 266 is disposed in the opening 241A of the support plate 240. The support plate 240 rests on a lip 266C of the transfer pin 266 formed between the main body 266A and the peg 266B. The gap 259 is further formed in between the pedestal plate 260A and the support plate 240. In the depicted embodiment, the gap 259 beneficially allows the pedestal 260 and/or the reflector plate 62 to be adjusted such that the pedestal plate 260A and the reflector plate 62 are at a same level and form a flat surface 264. Thus, the adapter ring 242 may adjust the distance (D) between the substrate 32 (FIG. 2A) and the flat surface 264. In some embodiments, the gap 259 may beneficially insulate the substrate from unintentional heating from the lamps 46 (FIG. 1). In some embodiments, it may be desirable to minimize the gap 259 to the heat the substrate 32.

FIG. 2D shows a magnetic fluid seal 279 between the pedestal shaft 260B and the pedestal housing 280. In particular, FIG. 2D shows the magnetic fluid seal 279 between the pedestal sleeve 270 and the pedestal housing 280. The magnetic fluid seal 279 may also be referred to as a ferrofluid seal.

The magnetic fluid seal 279 may be used to maintain a vacuum inside of the chamber 110 (FIG. 1) while the pedestal 260 (FIG. 2A) to rotates. The magnetic fluid seal 279 comprises a magnet 272 nested in a pole piece 274 (shown as two pole pieces). An O-ring 275 forms a seal between the pole piece 274 and the pedestal housing 280. The pedestal sleeve 270 comprises a plurality of ridges 271. A gap 276 is formed in between the pedestal sleeve 270, including the ridges 271, and the pole piece 274. A magnetic fluid 278 is disposed in the gap 276. The magnet 272 forms magnetic force lines (not shown), through the pole piece 274 and the ridges 271 of the pedestal sleeve 270. The magnetic force lines attract the magnetic fluid 278, which forms the magnetic fluid seal 279 between the rotatable pedestal sleeve 270 and the stationary pole piece 274. In particular, the magnetic fluid 278 forms a plurality of magnetic fluid seals 279 between each ridge 271 of the ridges 271 and a corresponding pole piece 274 as the pedestal sleeve 270 rotates.

In some embodiments, the rotatable assembly 30 does not include the pedestal sleeve 270. For example, the pedestal shaft 260B may include the ridges 271 and the magnetic seal may be form a seal between the ridges 271 of the rotatable pedestal shaft 260B and the stationary pole piece 274.

In some embodiments, O-rings may be used instead of the seal formed by the magnetic fluid 278.

Figure 3:
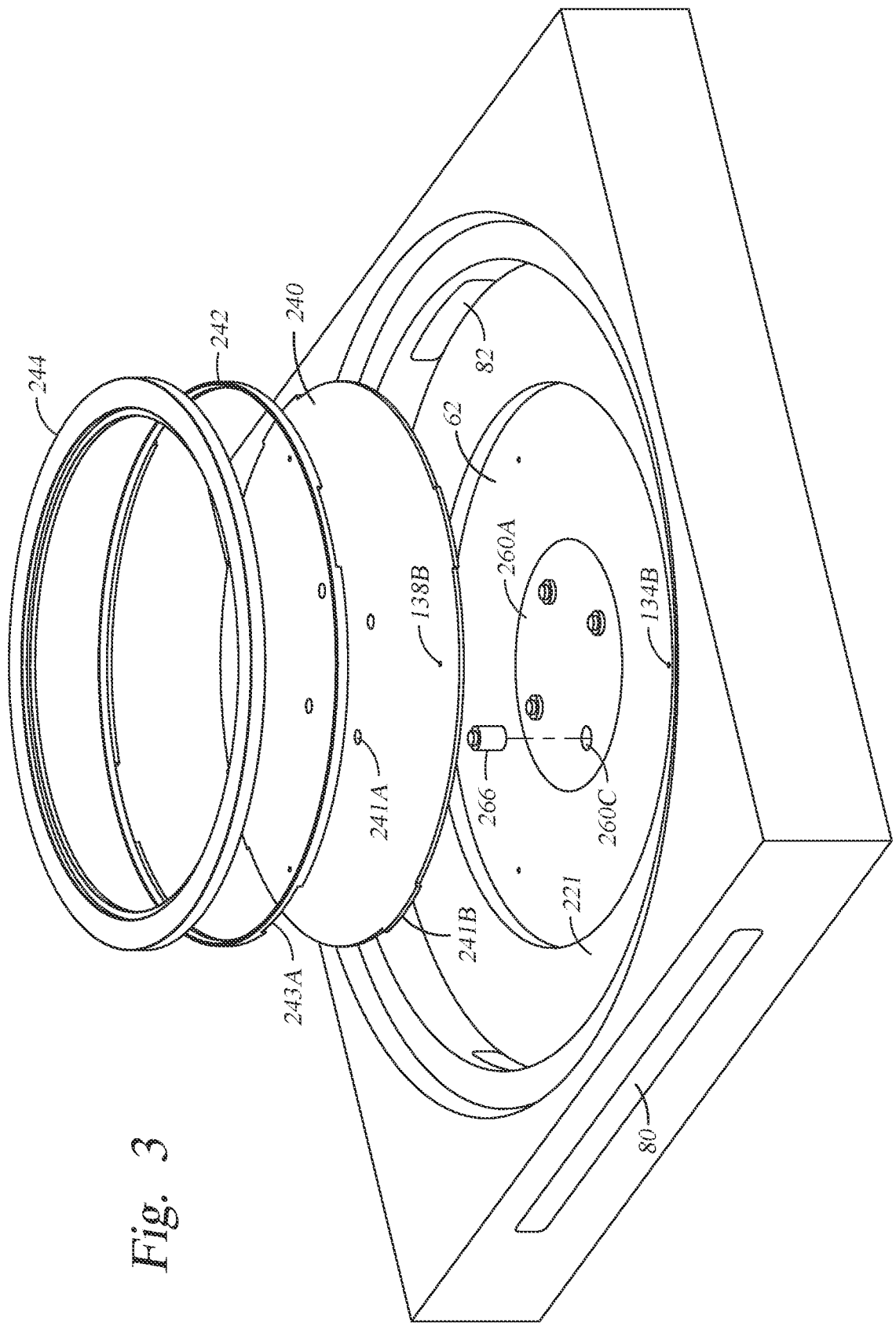
FIG. 3 depicts an exploded trimetric view of a rotatable assembly, according to some embodiments.
Figure 4A:
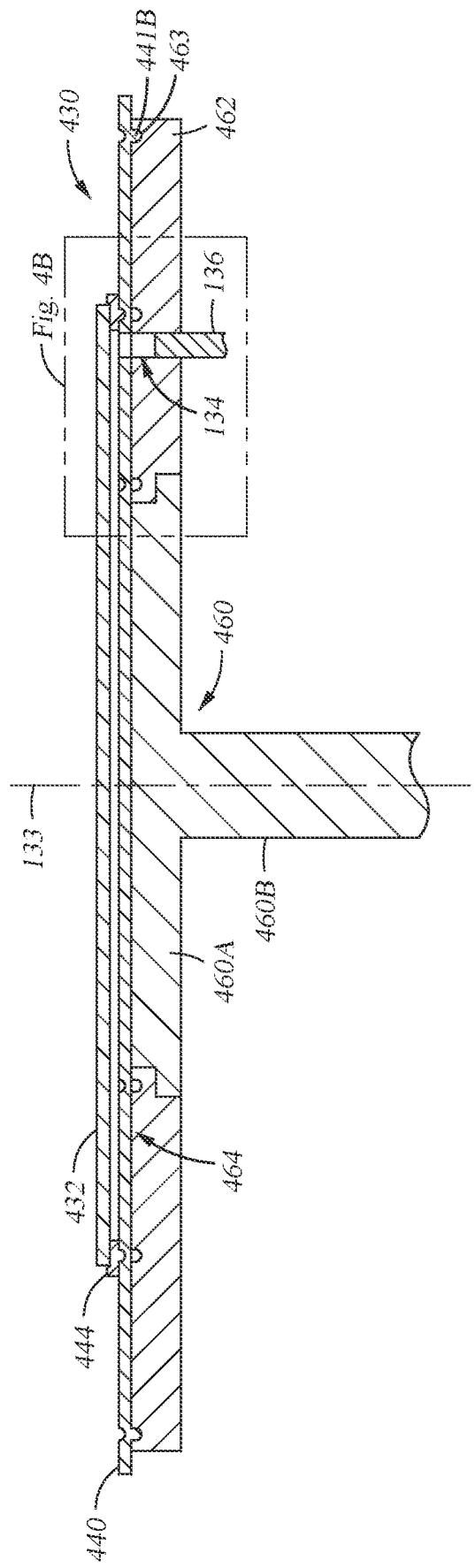
FIGS. 4A and 4B depict different cross-sectional views of rotatable assemblies, according to some embodiments.
Figure 4B:
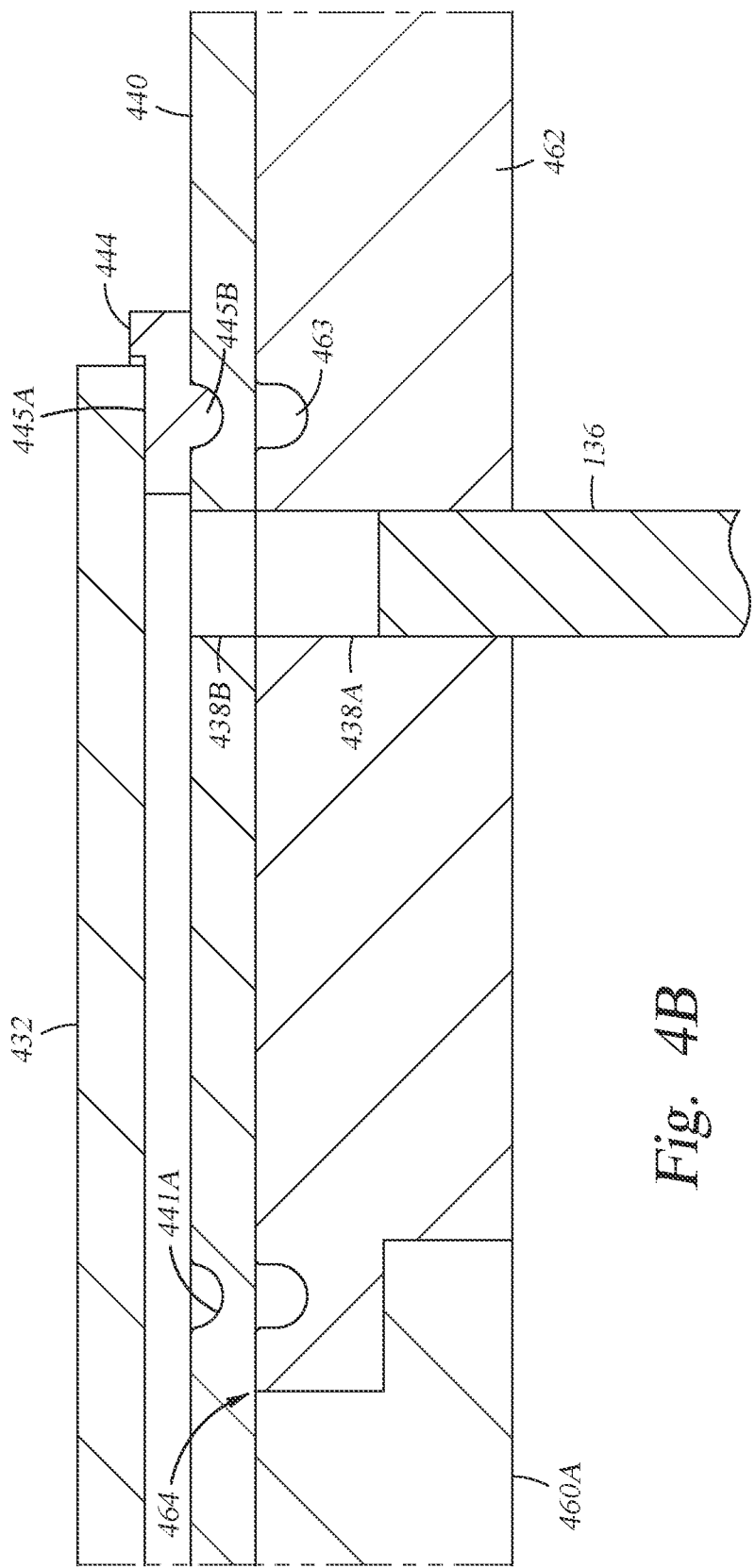

FIG. 3 depicts an exploded trimetric view of the chamber body 20 and the rotatable assembly 30, according to some embodiments. As shown, the support plate 240 is removably engaged with the pedestal plate 260A via the transfer pins 266, through the openings 241A in the support plate 240 and the openings 260C in the pedestal plate 260A. As also shown, the notches 243A of the adapter ring 242 and the tabs 241B of the support plate 240 are removably engaged as previously discussed in relation to FIG. 2B FIGS. 4A and 4B depict different cross-sectional views of a rotatable assembly 430, according to some embodiments. The substrate 432 is not shown in FIG. 4B in order to clearly show components of the rotatable assembly 430.

The rotatable assembly 430 comprises the pedestal 460 having the pedestal plate 460A and the pedestal shaft 460B. In the embodiment shown, the reflector plate 462 couples to and rotates with the pedestal plate 460A and forms a supporting surface 464 to support a support plate 440. The reflector plate 462 has a plurality of grooves 463 formed therein. The support plate 440 may have a plurality of tabs 441B formed thereon to engage the grooves 463 of the reflector plate 462 allowing removable coupling of the support plate 440 to the reflector plate 462. The grooves 463 may be continuous or discontinuous as may the corresponding tabs 441B. The grooves 463 beneficially allow different support plates 440 to be used with the reflector plate 462. In some embodiments, the grooves 463 are discontinuous and may be used to orient or "clock" a position of the support plate 440 to the reflector plate 462.

The rotatable assembly 430 further comprises an edge ring 444 having at least one tab 445B. The tab 445B may correspond to and engage at least a portion of a plurality of grooves 441A in the support plate 440 to allow the edge ring 444 to removably couple to the support plate 440. The grooves 441A and the tab 445B may be continuous or discontinuous as previously discussed. The grooves 441A beneficially allow different edge rings 444 to be used with the support plate 440. The substrate 432 may rest on a lip 445A of the edge ring 444.

The rotatable assembly 430 includes a plurality of openings 438 (e.g., openings 438A and 438B) in which the lift pins 136 may be aligned with and inserted through for raising and lowering a substrate. For example, the reflector plate 462 may include the openings 438A and the support plate 440 may include the openings 438B. The system controller 199 (FIG. 2A) may align the openings 438 of the rotatable assembly 430 with the openings 134A of the chamber body 20 as discussed in relation to FIGS. 1, 2A, and 2B.

Although grooves and tabs are discussed in relation to certain components, embodiments are contemplated having an inverse configuration. For example, a tab of the reflector plate 462 may removably couple the reflector plate 462 to a groove of the support plate 440. A tab of the adapter ring 242 (FIG. 3) may removably couple the adapter ring 242 to a notch of the support plate 240 (FIG. 3).

In some embodiments, the rotatable assembly 430 may comprise an adapter ring (not shown), similar to the adapter ring 242 of FIG. 2B, having a tab and/or groove that corresponds to the groove 463 and/or tab 445B.

In some embodiments, the reflector plate 462 couples to the pedestal plate 460A through a frictional force. In some embodiments, an adhesive may be used to couple the reflector plate 462 to the pedestal plate 460A. In some embodiments, the reflector plate 462 and the pedestal plate 460A may be coupled using mating features, such as the tabs 445B and the groove 441A.

In some embodiments, the configurations of the rotatable assembly 430 may be applied to the rotatable assembly 30 discussed in FIGS. 2A-2D. For example, the support plate 240 may have a groove 441A to accept a tab (not shown) of the adapter ring 242 or the edge ring 244.

Example Controller for a Rotatable Assembly

Figure 5:
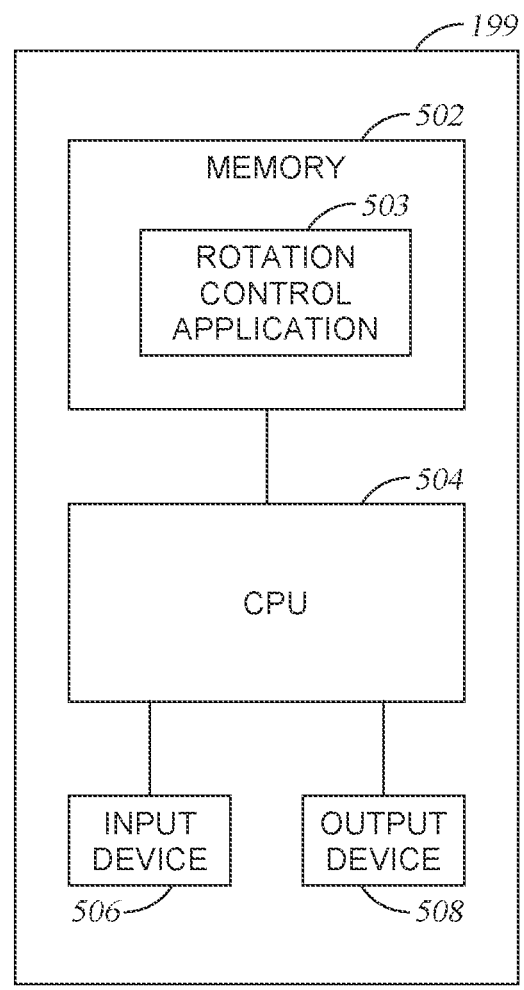
FIG. 5 depicts a block diagram of a control system for a rotatable assembly of an RTP chamber, according to one embodiment.

FIG. 5 depicts a functional block diagram of the system controller 199 for a rotatable assembly (e.g., the rotatable assemblies 30 or 430 in FIGS. 2A-2D and 4A-4B) of an RTP chamber (e.g., the chamber 110 in FIG. 1), according to one embodiment.

The system controller 199 includes a processor 504 (e.g., a central processing unit (CPU)) in data communication with a memory 502, an input device 506, and an output device 508. Although described separately, it is to be appreciated that functional blocks described with respect to the system controller 199 need not be separate structural elements. For example, the processor 504 and memory 502 is embodied in a single chip. The processor 504 can be a general purpose processor, a digital signal processor ("DSP"), an application specific integrated circuit ("ASIC"), a field programmable gate array ("FPGA") or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 504 can be coupled, via one or more buses, to read information from or write information to memory 502. The processor may additionally, or in the alternative, contain memory, such as processor registers. The memory 502 can include processor cache, including a multi-level hierarchical cache in which different levels have different capacities and access speeds. The memory 502 can also include random access memory (RAM), other volatile storage devices, or non-volatile storage devices. The storage can include hard drives, flash memory, etc. Memory 502 can also include a rotation control application 503 that is used to control the position of the rotatable assembly 30 or 430 as described in FIGS. 1, 2A-2D, and 4A-4B. Rotation control application 503 may be code that can be executed by processor 504. In various instances, the memory is referred to as a computer-readable storage medium. The computer-readable storage medium is a non-transitory device capable of storing information, and is distinguishable from computer-readable transmission media such as electronic transitory signals capable of carrying information from one location to another. The non-transitory computer readable medium includes computer-executable instructions that, when executed by a processing system, cause the processing system to perform a method, as described in relation to FIG. 6, including: placing a substrate on an edge ring of the rotatable assembly, rotating the rotatable assembly about a central axis of a thermal processing chamber from a first position about the central axis to a second position about the central axis, rotating a substrate plate with a pedestal, forming a magnetic seal to maintain a vacuum inside the thermal processing chamber, and heating the substrate. Computer-readable medium as described herein may generally refer to a computer-readable storage medium or computer-readable transmission medium.

The processor 504 also may be coupled to an input device 506 and an output device 508 for, respectively, receiving input from and providing output to a user of the system controller 199. Suitable input devices include, but are not limited to, a keyboard, buttons, keys, switches, a pointing device, a mouse, a joystick, a remote control, an infrared detector, a bar code reader, a scanner, a video camera (possibly coupled with video processing software to, e.g., detect hand gestures or facial gestures), a motion detector, or a microphone (possibly coupled to audio processing software to, e.g., detect voice commands). The input device 506 includes a positional sensor as discussed in relation to FIGS. 1 and 2A-2D. Suitable output devices include, but are not limited to, the motor 268 as discussed in relation to FIG. 2A as well as visual output devices, including displays and printers, audio output devices, including speakers, headphones, earphones, and alarms, additive manufacturing machines, and haptic output devices.

Example Method for Using a Rotatable Assembly

Figure 6:
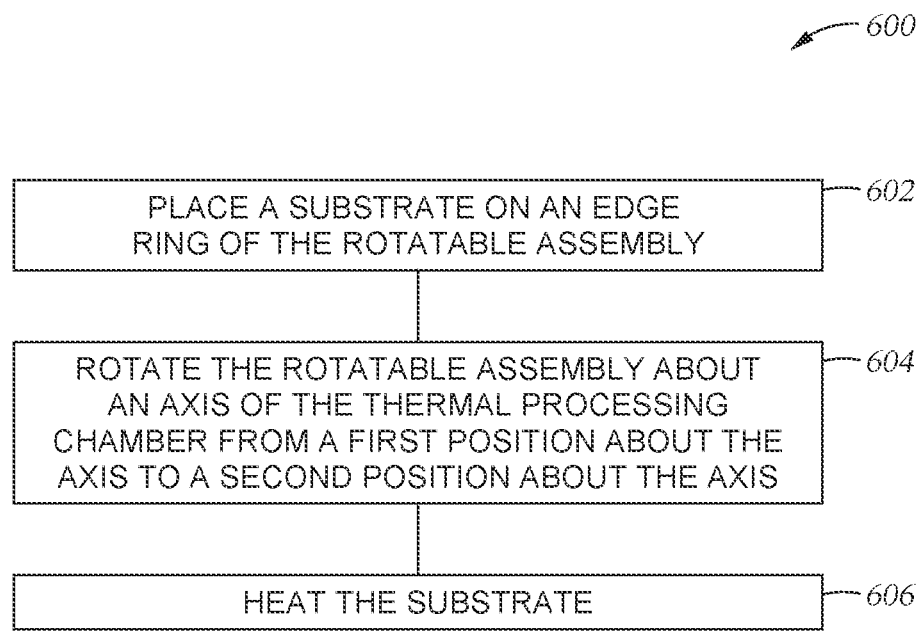
FIG. 6 depicts a flowchart of a method for using a rotatable assembly in an RTP chamber, according to one embodiment.

FIG. 6 depicts a flowchart of a method 600 for using a rotatable assembly in an RTP chamber, according to one embodiment. The method 600 may be performed in any suitable processing chamber, such as the chamber 110 discussed in relation to FIGS. 1-2. The chamber 110 includes the rotatable assembly 30 or 430 set forth in FIGS. 1-4.

At operation 602, the method 600 includes placing a substrate on an edge ring of the rotatable assembly, as described above with respect to FIGS. 1-4. In some embodiments of the method 600, the rotatable assembly includes the edge ring removably coupled to the substrate support plate through an adapter ring. The edge ring is configured to support the substrate.

At operation 604, the method 600 includes rotating the rotatable assembly about an axis of the thermal processing chamber from a first position about the axis to a second position about the axis, as described above with respect to FIGS. 1, 2A, 2D, and 4A. In some embodiments of the method 600, the rotatable assembly includes a pedestal having a pedestal shaft and a pedestal plate. The pedestal plate is coupled to an end of the pedestal shaft and the pedestal shaft extends outside the thermal processing chamber. In some embodiments of the method 600, the rotatable assembly includes a substrate support plate removably coupled to the pedestal plate. The substrate support plate rotates with the pedestal as part of the rotatable assembly. In some embodiments of the method 600, a magnetic fluid seal is formed to maintain a vacuum inside the thermal processing chamber.

At operation 606, the method 600 includes heating the substrate, as described above with respect to FIGS. 1-4. Heating the substrate may occur before, during or after rotating the rotatable assembly at operation 604.

In some embodiments, a lamp assembly heats a first side of the substrate. In some embodiments, a reflector plate absorbs heat from the lamp assembly and radiates the heat towards a second side of the substrate. Some embodiments further include lifting the substrate using a plurality of lift pins when the rotatable assembly is in the first position. Some embodiments further include lifting the substrate support plate using the plurality of lift pins when the rotatable assembly is in a third position about the axis.

Note that FIG. 6 is just one example of a method, and other methods including fewer, additional, or alternative blocks are possible consistent with this disclosure.

Embodiments of the present disclosure have been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A thermal processing chamber, comprising:
   a rotatable assembly configured to rotate about an axis of the thermal processing chamber, comprising:
     a rotatable pedestal comprising a pedestal shaft and a pedestal plate, wherein the pedestal plate is coupled to an end of the pedestal shaft and the pedestal shaft extends outside the thermal processing chamber, the pedestal shaft disposed in a pedestal housing coupled to the thermal processing chamber; and
     a substrate support plate removably coupled to the pedestal plate and disposed on a plurality of transfer pins forming a gap between the substrate support plate and the pedestal plate; and
   a magnetic fluid seal disposed between the pedestal shaft and the pedestal housing, the magnetic fluid seal configured to maintain a vacuum inside the thermal processing chamber.

2. The thermal processing chamber of claim 1, further comprising a plurality of lift pins configured to lift the substrate when the rotatable assembly is in a first position about the central axis.

3. The thermal processing chamber of claim 2, wherein:
   the substrate support plate has a first plurality of openings; and
   the plurality of lift pins are configured to extend through the first plurality of openings when the plurality of lift pins lift the substrate.

4. The thermal processing chamber of claim 3, wherein the plurality of lift pins are configured to lift the substrate support plate when the rotatable assembly is in a second position about the central axis.

5. The thermal processing chamber of claim 4, further comprising a system controller configured to control rotation of the rotatable assembly about the central axis, wherein the system controller is configured to move the rotatable assembly from a third position about the central axis to the first position.

6. The thermal processing chamber of claim 5, wherein the system controller is configured to receive data from a rotation sensor.

7. The thermal processing chamber of claim 1, wherein the pedestal shaft is disposed in a pedestal sleeve configured rotate the pedestal.

8. The thermal processing chamber of claim 1, further comprising a motor configured to rotate the pedestal shaft.

9. The thermal processing chamber of claim 8, wherein the motor is configured to rotate the pedestal sleeve.

10. The thermal processing chamber of claim 7, wherein the magnetic seal is formed around the pedestal sleeve.

11. The thermal processing chamber of claim 1, further comprising a reflector plate disposed inside the thermal processing chamber, wherein the reflector plate surrounds the pedestal shaft.

12. The thermal processing chamber of claim 11, wherein the reflector plate has a channel formed therein and the channel is configured to connect to a chiller.

13. The thermal processing chamber of claim 11, wherein the reflector plate comprises a plurality of resistive heaters disposed therein and the resistive heaters are configured to heat the substrate.

14. The thermal processing chamber of claim 1, wherein the pedestal plate has a channel formed therein and the channel is configured to connect to a chiller.

15. The thermal processing chamber of claim 1, wherein the plurality of transfer pins removably couple the substrate support plate to the pedestal plate.

16. The thermal processing chamber of claim 1, further comprising an edge ring removably coupled to the substrate support plate through an adapter ring, wherein the edge ring is configured to support a substrate.

17. A rotatable assembly configured to rotate about an axis of a thermal processing chamber, the rotatable assembly comprising:
   a pedestal comprising a pedestal shaft and a pedestal plate, wherein the pedestal shaft is disposed within a pedestal housing;
   a reflector plate coupled to the pedestal plate, wherein the reflector plate has a first plurality of features formed therein;
   a substrate support plate disposed on a plurality of transfer pins forming a gap between the substrate support plate and the pedestal plate and removably coupled to the reflector plate, wherein the substrate support plate comprises:
     a second plurality of features formed therein, and
     a third plurality of features formed therein and configured to couple to at least a portion of the first plurality of features; and
   a magnetic fluid seal disposed between the pedestal shaft and the pedestal housing.

18. The rotatable assembly of claim 17, further comprising an edge ring removably coupled to the substrate support plate, wherein:
   the edge ring comprises at least one tab configured to couple to at least a portion of the second plurality of grooves, and
   a lip configured to support a substrate.

19. The rotatable assembly of claim 17, further comprising a motor configured to rotate the pedestal shaft.

20. A thermal processing chamber, comprising:
   a rotatable assembly configured to rotate about a central axis of the thermal processing chamber, the rotatable assembly comprising:
     a pedestal comprising a pedestal shaft and a pedestal plate, wherein the pedestal shaft is disposed within a pedestal housing;
     a reflector plate coupled to the pedestal plate, wherein the reflector plate has a first plurality of features formed therein;
     a substrate support plate removably coupled to the reflector plate, wherein the substrate support plate comprises:
       a second plurality of features formed therein, and
       a third plurality of features formed therein and configured to couple to at least a portion of the first plurality of features;

an edge ring removably coupled to the substrate support plate, wherein:
the edge ring comprises at least one tab configured to couple to at least a portion of the second plurality of grooves, and
a lip configured to support a substrate;
a magnetic seal configured disposed between the pedestal shaft and the pedestal housing; and
a plurality of lift pins disposed in a first plurality of openings formed by the thermal processing chamber, wherein:
the lift pins are configured to be disposed in a second plurality of openings formed by the reflector plate and a third plurality of openings formed by the substrate support plate when the rotatable assembly is in a first position about the central axis, and
the lift pins are configured to lift the reflector plate when the rotatable assembly is in a second position about the central axis.

\* \* \* \* \*